United States Patent [19]
Gale et al.

[11] Patent Number: 5,966,631
[45] Date of Patent: Oct. 12, 1999

[54] FORCED PLUG PROCESSING FOR HIGH ASPECT RATIO STRUCTURES

[75] Inventors: Glenn W. Gale, Essex Junction; Bernadette Pierson, South Hero; William Syverson, Colchester, all of Vt.

[73] Assignee: International Business Machines Corporation, Armonk, N.Y.

[21] Appl. No.: 08/944,207

[22] Filed: Oct. 3, 1997

[51] Int. Cl.$^6$ .................................................. H01L 21/4763
[52] U.S. Cl. ........................ 438/637; 438/668; 438/672; 438/675; 438/677; 438/906; 438/963
[58] Field of Search .................... 438/637, 668, 438/672, 675, 677, 906, 963

[56] References Cited

U.S. PATENT DOCUMENTS 5,261,965  11/1993  Moslehi .
5,350,480   9/1994  Gray .

OTHER PUBLICATIONS

IBM TDB vol. 23 No. 5, Oct. 1980: Anti–Turbulent Vent (Vacuum) Device: J.E. Jamieson, S.I. Petvai and C. Rosu.

*Primary Examiner*—Richard A. Booth
*Assistant Examiner*—David A. Zarneke
*Attorney, Agent, or Firm*—Ratner & Prestia; Eugene I. Shkurko

[57] ABSTRACT

A forced plug process for high aspect ratio structures. The process comprises the steps of providing a liquid plug in a high aspect ratio structure; increasing a gas pressure to force the liquid plug down into the high aspect ratio structure; and suddenly decreasing the gas pressure allowing the liquid plug to be ejected from the high aspect ratio structure. The process is useful for removing unwanted particles from a high aspect ratio structure, as well as for etching and coating the side walls of the structure.

19 Claims, 1 Drawing Sheet

FORCED PLUG PROCESSING FOR HIGH ASPECT RATIO STRUCTURES

BACKGROUND OF THE INVENTION

1. Field of the Invention

The invention relates to an improved process of cleaning, etching, or coating high aspect ratio structures. More particularly, the invention relates to a process whereby a liquid plug is initially forced down into a high aspect ratio structure and is then quickly ejected from the structure with enough force to dislodge and remove all contaminants.

2. Related Art

In the semiconductor industry, the formation of high aspect ratio structures on wafer surfaces is a common practice. These high aspect ratio structures can perform various functions, such as acting as trenches for capacitors. In particular, high aspect ratio structures or trenches are important to the function of the device. Therefore, it is essential that the trench can be cleaned, coated, or etched thoroughly for proper functioning. At present, methods for treating a malfunctioning high aspect ratio structure include applying a new coating over the existing, incomplete coating or electrically isolating the malfunctioning high aspect ratio structure. These alternative solutions are generally not regarded as optimally effective.

It is generally difficult to get materials into and out of high aspect ratio structures, such as trench capacitors, due to surface tension, contact angle, and certain unique geometric considerations. In particular, high aspect ratio structures can have a huge differential in dimensional ratio (i.e., 40:1 differential). The problems are exacerbated when the high aspect ratio structures are extremely small, such as those located on semiconductor wafers. There are methods disclosed in the prior art for cleaning, coating, and etching wafer surfaces which include megasonics, excimer laser beam irradiation, and condensed-phase processing.

Excimer laser beam irradiation is a vapor phase system that attempts to remove surface particles by using a laser beam to scan the substrate within which the trench is formed. Although effective, the process requires a scan of the entire substrate and has several significant drawbacks. First, and foremost, this process is only effective on relatively flat wafer surfaces. Second, excimer lasers are expensive and require significant additional costs to maintain and operate. Third, the scanning process itself may cause local thermal stresses that adversely affect the physical characteristics and performance of the substrate. Finally, this process is only applicable to particle removal.

Condensed-phase processing is a method for getting a reactant onto a wafer surface and then removing it. This process provides for suitable process gases to condense and form a film on a cool substrate surface. The condensation is followed by a pulsed process energy source which is used to thermally activate the surface and provide for rapid evaporation of the film. Although effective, this process is again only applicable to relatively flat wafer surfaces. In addition, this process is only effective on volatile species, and not for particle removal: it is believed that contaminants or foreign materials lodged in the trench structures are resistant to this evaporation cleaning process.

In recent technological efforts, attempts have been made to introduce sophisticated directional etching or deposition processes in commercial semiconductor fabrication. These processes incorporate the use of molecular beam technology. This technology has not been effective in, for example, providing uniform deposition, which is necessary for proper coating of high aspect ratio structures.

Therefore, there is a need for a better process of removing material from or coating material onto high aspect ratio structures. Such structures are becoming more and more common in many industries and, in particular, the semiconductor industry.

SUMMARY OF THE INVENTION

To meet this and other needs, and in view of its purposes, the present invention provides a process comprising the steps of:

A. providing a substrate having a surface and at least one opening in that surface;

B. providing a liquid plug in the opening;

C. increasing a gas pressure near the opening for moving the liquid plug in a first direction through the opening; and D. decreasing the gas pressure near the opening for moving the liquid plug in a second direction through the opening.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DESCRIPTION OF THE PREFERRED EMBODIMENT(S)

The invention generally comprises a process for removing material from and depositing material into a high aspect ratio structure. The process begins by forming a liquid plug at the top of the high aspect ratio structure. Gas pressure is then applied to the plug to force it towards the bottom of the high aspect ratio structure. As a result, compressed gas is trapped beneath the intact plug. The applied gas pressure is then quickly released, allowing the compressed gas to eject the plug from the structure. The process is useful for many purposes, including removing contaminants from the structure, etching the walls of the structure, and coating material onto the walls of the structure.

Figure 1:
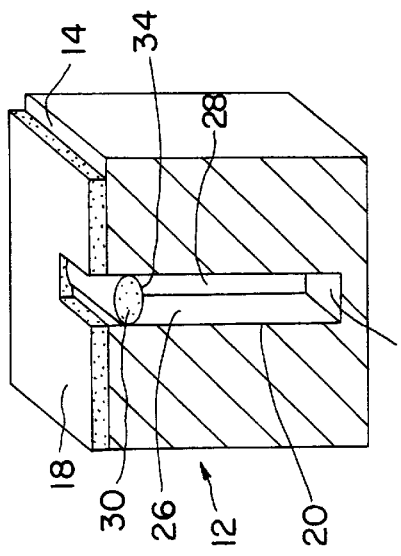
FIG. 1 is a cut-away view of a high aspect ratio structure within a substrate, showing a liquid film formed on the surface of the substrate.

Referring now to the drawing, wherein like reference numerals refer to like elements throughout, FIG. 1 shows a substrate 12 having a surface 14. Although the process of the invention is preferably used on a semiconductor wafer substrate, the process is applicable to any other substrate which contains high aspect ratio structures and which may require treatment such as that provided by the process of the invention.

Also depicted in FIG. 1 is a high aspect ratio structure 20 which is formed within the substrate 12 (a portion of the substrate 12 has been cut away in the drawing in order to view the interior of the high aspect ratio structure 20). Generally, a high aspect ratio structure 20 extends into the substrate 12 from the surface 14, and comprises an open top 22, a bottom 24, and at least one side wall 26, extending from the top 22 to the bottom 24 of the structure 20. The side wall 26 and the bottom 24 define an interior 28. The high aspect ratio structure 20 can be shaped in any number of ways, such as oval, circular, elongated, etc., any of which are treatable by the process of the invention. The particular construction of the high aspect ratio structure 20 depicted in the drawing is simplistic and comprises four side walls 26 which form a parallelogram shaped interior 28.

Figure 2:
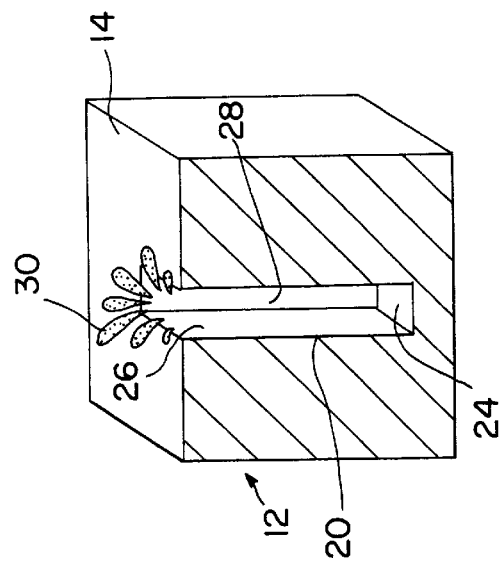
FIG. 2 shows a liquid plug formed in the open top of the high aspect ratio structure following initial gas pressure.

The process of the invention is also depicted by the sequence shown in FIGS. 1–4, and is as follows. Initially, as shown in FIGS. 1 and 2, a liquid plug 30 having a head 32 and an underside 34, is formed in the top 22 of the interior 28 of the high aspect ratio structure 20. The liquid plug 30 can be formed in any manner, although the following process is preferred. The atmosphere surrounding the high aspect ratio structure is pressurized to approximately 2× ambient (this increased pressure will ensure proper plug ejection as described later). A small quantity of liquid is then deposited onto the substrate surface 14. The substrate 12 is then rotated at a high rotational speed (preferably 1000 rpm) to form a thin liquid film 18 (see FIG. 1). It is preferred that the approximate thickness of the film be 0.1–0.5 um, although the thickness will depend upon the geometry of the high aspect ratio structure 20, the dimensions of the liquid plug 30 being formed, the viscosity of the liquid, and the contact angle of the liquid on the substrate surface 14. The substrate 12 can then be slowed or stopped entirely, so long as the liquid film maintains its integrity, At this point, the surface 14 is subjected to a slight gas pressure increase, to preferably 3× to 4× ambient pressure, which separates and slightly compresses a portion of the liquid into the top of the high aspect ratio structure 20 to form the liquid plug 30 (see FIG. 2).

In an alternate embodiment, the liquid can be deposited onto the wafer surface in a variety of ways known in the art, such as, for example, condensing a vapor on the substrate surface 14. Any method of liquid deposition on the surface can be used, so long as proper plug formation can occur as described above.

The formed liquid plug 30 will remain at the top 22 of the high aspect ratio structure 20 due to the ambient gas pressure which is naturally trapped between the underside 34 of the plug 30 and the interior 28 of structure 20. The gas remains trapped within the interior 28 of the high aspect ratio structure 20 because the plug 30 is in contact with all walls 26 of the structure. The integrity of the plug 30 will remain fixed due to the saturated gas condition of the liquid plug 30 in relation to both the trapped gas and the gas pressured atmosphere (described in detail below).

Figure 3:
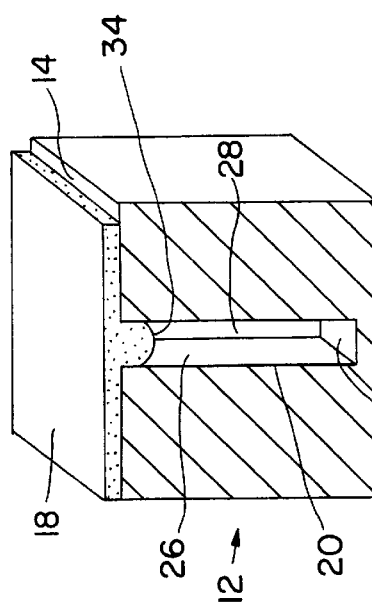
FIG. 3 shows the liquid plug when subjected to an increased gas pressure forcing it down into the high aspect ratio structure.

Once the plug 30 is in position in the high aspect ratio structure 20, the surface 14 of the substrate 12 is then subjected to a much greater gas pressure increase. The increased pressure is such that it forces the liquid plug 30 down into the structure 20 near or to the bottom 24 as depicted in FIG. 3. As the plug 30 is forced down into the structure 20, the trapped gas between the plug 30 and the bottom 24 of the high aspect ratio structure 20 becomes more and more compressed. As a result, there is a significant amount of pressure on either side of the liquid plug 30. The pressure applied to the surface of the substrate 12 preferably is enough to force the plug 30 down as close to the bottom 24 as possible without destroying the integrity of the plug 30. Again, it is important that either the increased gas pressure comprise a gas of low solubility to the liquid 30, or the liquid plug 30 be in a saturated gas condition with regard to that gas.

It is important that the applied pressure is not excessive. In particular, if too much pressure is applied, the integrity of the plug 30 may be lost and the plug will break apart. Generally, the pressure can be as great as required to drive the plug 30 as close to the bottom 24 of the high aspect ratio structure 20 as desired without destroying the integrity of the liquid plug 31. It is preferred that the pressure be 5× to 1000× ambient pressure and, more preferably, 10× to 100× ambient pressure, and even more preferably 10× to 20× ambient pressure.

Figure 4:
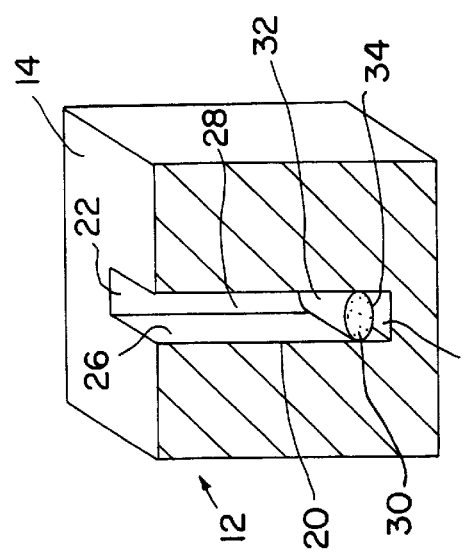
FIG. 4 shows the liquid plug as it is being ejected from the high aspect ratio structure.

Once the liquid plug 30 is forced down into the high aspect ratio structure 20 as far as desired, the applied gas pressure is rapidly released to, preferably, 1× ambient pressure. The rapid release of pressure causes the compressed gas to forcibly eject the intact liquid plug 30 and all particulate contaminants from the high aspect ratio structure 20, as depicted in FIG. 4. Complete ejection of the plug 30 is ensured due to the initial 2× ambient pressure used at the time of plug formation, as described above. As the plug 30 is being ejected from the high aspect ratio structure 20, the drag of the liquid plug 30 along the walls of the structure 20, coupled with the incompressibility of the liquid used, effectively removes particulates from the walls, etches coatings from the walls, or deposits a coating onto the walls, as described in more detail below.

A sweeping gas can be used to ensure that any ejected debris is prevented from re-depositing onto the substrate surface 14. This sweeping gas can also be used to evaporate any remaining liquid from the substrate surface 14. Alternatively, both ejected particles and remaining liquid can be removed from the substrate surface 14 by spinning the substrate 12.

In a preferred embodiment, the process is performed on the substrate 12 within a process chamber (not shown). A process chamber allows one having ordinary skill in the art to manipulate pressurization and liquid deposition in a controlled fashion.

For purposes of this invention, the term liquid is generally defined as a material in pure form or with a second material dissolved therein. For the process to function properly, it is important that the liquid plug 30 comprise a liquid which can tolerate the rigors of the process. In particular, it is important that the liquid plug 30 comprise a liquid which is able to maintain its integrity under extreme pressures and has a compatible viscosity/gas-solubility relationship.

The liquid plug 30 may comprise different liquids, depending upon various factors. For instance, contact angle and surface tension will depend partially upon the substrate material. For example, where the substrate material is hydrophobic (i.e., bare silicon semiconductor wafers), a preferred liquid is purified water because the contact angle is very close to 90°. Alternatively, when contaminants are to be removed from the high aspect ratio structure 20, the addition of a cleaning agent is useful. A mixture containing 95% water and 5% cleaning agent, for example, is satisfactory. Although a variety of liquid plug 30 liquids may be used, depending upon the substrate and the process that is being performed, the essential features of the liquid plug 30, as described above, will remain the same.

As referred to earlier, the gas used to apply the pressure to the liquid plug 30 should preferably have a low solubility in that particular liquid. It is important that the liquid plug 30 is not destroyed by the pressure, and a low solubility gas ensures that the liquid plug 30 will remain intact during pressurization. An intact plug is critical for proper liquid plug ejection; the plug 30 must drag along the side walls 26 of the high aspect ratio structure 20 until ejection from the open top 22. Some examples of low solubility gases include helium, argon, nitrogen, and oxygen, among others. Of course, the gas selection will vary depending upon the composition of the liquid plug 30.

In any situation where a high aspect ratio structure needs treatment, it is generally preferred that the process be repeated several times. In particular, repeated cycling of the condensation, pressurization, and sudden depressurization steps should be utilized to fully and effectively complete the application, whether it be removal, etching, or coating of a high aspect ratio structure.

In an alternate embodiment, a drying cycle is added as a final step in the process. The drying cycle is incorporated to remove any residual liquid which may have remained within the high aspect ratio structure during normal cycling. The drying step comprises a cycle in which the liquid deposition/vapor condensation step is eliminated. Therefore, the cycle entails only a pressurization step followed by a depressurization step. Generally, the same gas used to apply the pressure in the normal cycle can be used in the drying step because, in either case, a low solubility gas is most effective.

The process of the invention can be used for various purposes in treating high aspect ratio structures. Three of the more commonly used purposes include contaminant removal, etching, and coating. The characteristics of both the liquid plug 30 and the gas used to apply the pressure may differ slightly in each of the below described cases.

Contaminant Removal:

As mentioned above, the process of the invention can be used to dislodge or remove contaminants and all other unwanted particles deposited within or adhered to the walls of the structure 20. The primary goal of such a removal process is to eject all unwanted debris which has entered or is formed within the high aspect ratio structure 20. In the case of semiconductor wafers, typical debris includes dust, dirt, silicon debris, polymer films, and other contaminants. In order to effectively eject such debris from the high aspect ratio structure, it is important that the liquid plug 30 have a low enough viscosity to both remain intact when the pressure is released and provide a viscous drag along the walls of the structure 20 during the ejection process. In particular, it is important that the liquid plug 30 have a high surface tension. Therefore, it is preferred that the liquid plug 30 comprise purified water, although any low viscosity liquid capable of remaining intact under the pressures applied in the process are contemplated and can be used.

It is also preferable to generate as much compression between the plug 30 and the bottom 24 of the high aspect ratio structure 20 as possible without destroying the plug 30. The more compression that is generated, the greater the resulting ejection force on the plug 30 and, thus, the more effective the removal of the particulates. It is equally important that the liquid plug 30 have a high surface tension and a high contact angle with the surface against which it rests. Therefore, in general, a low viscosity liquid is preferred for the removal process.

Etching:

The process of the invention can also be used to etch the side walls 26 of the high aspect ratio structure 20. Etching is useful in, for example, removing a film or a process reactant which has been coated onto the side walls 26 of the high aspect ratio structure 20. In many cases, a protective film or coating will be applied to the walls 26 of the structure 20 to protect the walls 26 during certain processing steps. Once that particular processing step is completed, the protective coating may need to be removed or etched from the side walls 26.

For the etching process, it is preferred that the liquid plug 30 not have as high a surface tension as that used for particulate removal as described above. It is important, in the etching process, that there be uniformity of the coating removal from the side walls 26. An example of a satisfactory liquid for use in the etching process is hydrofluoric acid which is useful in etching or removing silicon dioxide, a common protective coating material.

As with the removal process, it is important that the liquid plug 30 still have a relatively high surface tension and a high contact angle with the surface against which it rests. Therefore, in general, a low viscosity liquid is also preferred for the etching process. A key feature of using this process is that a film can be etched from the side walls 26 of a high aspect ratio structure 20 only, without removing the film from the surface of the substrate. This is often necessary in the processing of semiconductor wafers.

Coating:

The process of the invention is further useful in depositing or coating material onto the side walls 26 and bottom 24 of a high aspect ratio structure 20. Often in the semiconductor industry, it becomes necessary, in the processing of the semiconductor chips, to coat the bottom 24 and interior side walls 26 of a high aspect ratio structure with a particular material. For example, in the case of capacitors, it is necessary to apply a coating of insulating material on the entire interior 28 of the structure 20, including the bottom 24 and the side walls 26 so that the structure can subsequently be filled with another material for the chip capacitor. Other examples of coating materials include node insulating films and protective coatings, among others.

The coating process entails the application of one or more molecular layers of a material onto the walls 26 and bottom 24 of the high aspect ratio structure 20. Therefore, the properties of the liquid, such as viscosity, determine the coating thickness of the material and effectiveness of the coating process in general. In particular, the more viscous the liquid plug, the greater the coating thickness.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A process for treating high aspect ratio structures comprising the steps of:
    A. providing a substrate having a surface and at least one opening with a high aspect ratio in the surface;
    B. providing a liquid plug in the opening;
    C. increasing a gas pressure near the opening for moving the liquid plug in a first direction through the opening; and
    D. decreasing the gas pressure near the opening for moving the liquid plug in a second direction through the opening.

2. The process of claim 1 wherein step D further comprises decreasing the gas pressure near the opening sufficiently to eject at least a portion of the liquid plug from the opening.

3. The process of claim 1 wherein a pressure of approximately 2× ambient is applied to the high aspect ratio structure before step B.

4. The process of claim 3 wherein the liquid plug is provided in the opening by depositing a thin liquid film onto the substrate surface and increasing said applied gas pressure to approximately 3× to 4× ambient pressure.

5. The process of claim 1 wherein the opening is defined by side walls and a bottom.

6. The process of claim 5 wherein step C further comprises moving the liquid plug to the bottom of the opening.

7. The process of claim 1 wherein the substrate is a semiconductor wafer.

8. The process of claim 1 wherein the liquid plug is a low viscosity liquid.

9. The process of claim 1 wherein the liquid plug is a high viscosity liquid.

10. The process of claim 1 wherein the gas has a low solubility in the liquid plug.

11. The process of claim 1 wherein the gas pressure of step C ranges from approximately 5× to 1000× ambient pressure.

12. The process of claim 11 wherein the gas pressure of step C ranges from approximately 10× to 20× ambient pressure.

13. The process of claim 1 wherein steps B and C are repeated.

14. The process of claim 1 further comprising the steps of:
E. increasing the gas pressure near the opening; and
F. decreasing the gas pressure near the opening.

15. The process of claim 1 wherein the process is performed within a process chamber.

16. A process for treating high aspect ratio structures comprising the steps of:
A. providing a substrate having a surface and at least one opening with a high aspect ratio in the structure
B. applying a pressure of approximately 2× ambient to the high aspect ratio structure;
C. providing a liquid plug in the opening by depositing a thin liquid film onto the substrate surface and increasing a gas pressure near the opening to approximately 3× to 4× ambient pressure;
D. increasing the gas pressure to approximately 5× to 1000× ambient pressure for moving the lquid plug in a first direction through the opening; and
E. decreasing the gas pressure near the opening for moving the liquid plug in a second direction through the opening and ejecting a portion of the liquid plug from the opening.

17. The process of claim 16 wherein the gas has a low solubility in the liquid plug.

18. The process of claim 16 wherein the opening is defined by side walls and a bottom.

19. A process for treating high aspect ratio structures comprising the steps of:
A. providing a substrate having a surface and at least one opening with a high aspect ratio in the structure;
B. applying a pressure of approximately 2× ambient to the high aspect ratio structure;
C. providing a liquid plug in the opening by depositing a thin liquid film onto the substrate surface and increasing a gas pressure near the opening to approximately 3× to 4× ambient pressure;
D. increasing the gas pressure to approximately 5× to 1000× ambient pressure near the opening of the structure for moving the liquid plug in a first direction through the opening, wherein the gas has a low solubility in the liquid plug; and
E. decreasing the gas pressure near the opening for moving the liquid plug in a second direction through the opening and ejecting a portion of the liquid plug from the opening.

* * * * *